United States Patent [19]

Koyama

[11] Patent Number: 4,633,291
[45] Date of Patent: Dec. 30, 1986

[54] HIGH-GAIN SEMICONDUCTOR DEVICE WITH CAPACITIVE COUPLING

[75] Inventor: Takeshi Koyama, Zushi, Japan

[73] Assignee: Tokyo Shibaura Denki Kabushiki Kaisha, Kawasaki, Japan

[21] Appl. No.: 584,506

[22] Filed: Feb. 28, 1984

[30] Foreign Application Priority Data

Mar. 1, 1983 [JP] Japan ............................ 58-33439

[51] Int. Cl.$^4$ ............... H01L 29/72; H01L 27/02; H01L 29/06
[52] U.S. Cl. ............................... 357/51; 357/20; 357/34; 357/35
[58] Field of Search ................... 357/51, 34, 20, 35

[56] References Cited

U.S. PATENT DOCUMENTS

| 4,211,941 | 7/1980 | Schade, Jr. ............ 357/51 |
| 4,245,231 | 1/1981 | Davies ................... 357/51 |
| 4,377,029 | 3/1983 | Ozawa ................... 357/51 |

FOREIGN PATENT DOCUMENTS

| 57-206062 | 12/1982 | Japan ................... 357/51 |
| 7808111 | 2/1979 | Netherlands .......... 357/51 |
| 1241285 | 8/1971 | United Kingdom . |
| 2002580 | 2/1979 | United Kingdom . |
| 2066607 | 7/1981 | United Kingdom . |

OTHER PUBLICATIONS

C. Benichou et al., "Additional Capacitor to Reduce the Rate Effect Sensitive in a Thyristor", *IBM Technical Disclosure Bulletin*, vol. 24, (1981), pp. 107–108.

*IBM Technical Disclosure Bulletin*, vol. 20, No. 12, May 1978, p. 5137, "Enhanced Storage Medium for a Memory Cell", by A. Bhattacharyya et al.

*Primary Examiner*—J. Carroll
*Attorney, Agent, or Firm*—Schwartz, Jeffery, Schwaab, Mack, Blumenthal & Evans

[57] ABSTRACT

An n-type region isolated by a p-type region is formed on a p-type substrate. Within the n-type region, in order to constitute an npn-transistor, an n$^+$ region, a p-type region and an n$^+$ region are formed. Within the n-type region, a p-type region is formed, and an insulating film and a metal layer are successively stacked on the p-type region to form an oxide film capacitor. The p-type region of the oxide film capacitor is in contact with the n$^+$ region of the npn-transistor by means of a metal wiring. Within a p-type region of the oxide film capacitor, an n$^+$ region is further formed. An additional npn-transistor may be formed by the n$^+$ region, the p-type region and n-type region.

10 Claims, 8 Drawing Figures

HIGH-GAIN SEMICONDUCTOR DEVICE WITH CAPACITIVE COUPLING

BACKGROUND OF THE INVENTION

1. Field of the Invention

The present invention relates to a bipolar type semiconductor device, and more particularly to a linear IC (Integrated Circuit) having an excellent crosstalk characteristic.

2. Technical Background of the Invention

Basically, linear ICs comprise amplifiers which amplify input signals without changing their waveforms. Usually, coupling capacitors for propagating solely signal components and blocking undesirable DC components are provided between stages of amplifiers which are RC-coupled.

The coupling capacitors provided in transistor circuits generally require large capacity although their capacity depends upon the frequency used. In integrated semiconductor devices, coupling capacitors are often of MOS structure.

However, in the prior art, when forming coupling capacitors of this kind, there additionally occurs a remarkable large capacity for parasitic capacitance, resulting in the occurrence of crosstalk.

SUMMARY OF THE INVENTION

Object of the Invention

An object of the present invention is to lessen crosstalk due to parasitic capacitance occurring in addition to coupling capacitors when fabricating bi-polar type linear ICs.

To achieve this object, a semiconductor device according to the present invention is so designed that a p-type region is used as a conductive region for an oxide film capacitor, the p-type region is formed within the same n-type region surrounded by the same isolation region together with an npn-transistor used as an emitter follower, and the p-type region of the oxide film capacitor is electrically connected to the emitter region of the npn-transistor. Thus, no current flows into a wafer through parasitic capacitance of the oxide film capacitance, thereby making it possible to prevent crosstalk.

DETAILED DESCRIPTION OF THE INVENTION

For better understanding of the present invention, the related devices will be described with reference to FIGS. 1 and 2, and then the present invention will be described with reference to FIGS. 3 to 8.

Related Art

Figure 1:
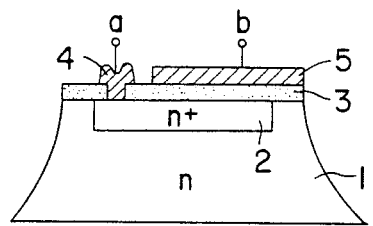
FIG. 1 is a cross sectional view illustrating a structure of a conventional oxide film capacitor.
Figure 2:
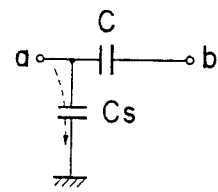
FIG. 2 is a circuit diagram for explaining how crosstalk is caused due to a parasitic capacitance being produced in the conventional oxide film capacitor.

A conventional device is formed, for instance, as shown in a cross sectional view of FIG. 1. An $n^+$ region 2 including n-type impurities in high concentration is formed in the vicinity of a surface area of an n-type region 1 including n-type impurities formed by an epitaxial growth or the like on the upper portion of a p-type substrate (not shown). An insulating layer 3 of silicon dioxide, etc. is formed as a dielectric on the upper portion of the $n^+$ region 2. Between a terminal labelled by a drawn through an aluminum electrode 4 from the $n^+$ region 2 and a terminal labelled by b drawn through an aluminum metal layer 5 formed on the insulating layer 3, an electric charge is stored.

Conventionally, a capacitor of such a MOS structure is formed in an n-type region different from a transistor, and a predetermined connection is implemented with an aluminum wiring.

However, in the capacitor thus constructed, an additional parasitic capacitance Cs extending from the electrode 4 to the side of wafer (n-type region 1) via the $n^+$ region 2 occurs in an equivalent sense. The parasitic capacitance Cs forms a circuit through which an electric current flows from the input terminal a directly to the ground of the substrate as shown by dotted line in a circuit diagram of FIG. 2. It often happens that the magnitude of the parasitic capacitance Cs becomes a considerable value (of order of pF). Accordingly, the magnitude of the parasitic capacitance cannot be negligible as compared with that of the capacitor itself. As a result, signal currents leak into the substrate due to the parasitic capacitance, resulting in the occurrence of crosstalk from the order of up to 10 dB.

Preferred Embodiments

Figure 3:
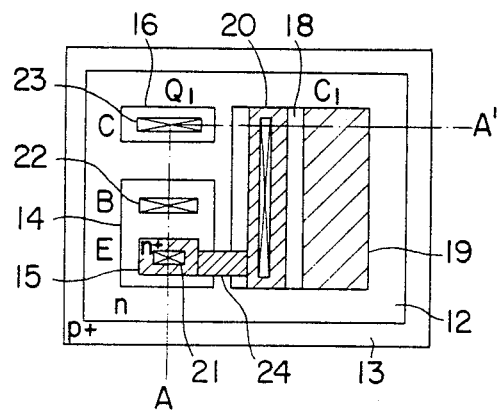
FIG. 3 is a plan view illustrating a fundamental structure of a semiconductor device according to the present invention.
Figure 4:
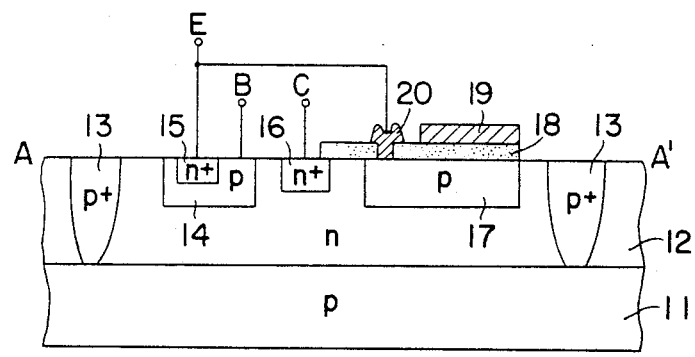
FIG. 4 is a cross sectional view taken along the lines A—A' shown in FIG. 3.

FIGS. 3 and 4 show a fundamental structure according to the present invention wherein FIG. 4 is a cross sectional view taken along the lines A—A' in a plan view of FIG. 3.

As seen from these drawings, an n-type region 12 formed on a p-type substrate 11 is surrounded by a $p^+$ isolation region 13 to form a so-called "island".

Within the n-type region 12, a p-type region 14 serving as a base of an npn-transistor, an $n^+$ region 16 serving as a collector thereof, and a p-type region 17 serving as a conductive region of a capacitor are formed. Within the p-type region 14 of the base, an $n^+$ region 15 serving as an emitter is further formed. On the upper portion of the p-type region 17, an insulating film 18 of silicon dioxide, etc. is formed. On the insulating film 18, an aluminum metal layer 19 is formed. Thus, a MOS type capacitor is formed. On the $n^+$ region 15, the p-type region 14, the $n^+$ region 16 and the p-type region 17, there are formed electrodes 21, 22, 23 and 20 drawn from respective regions so as to provide electrical connection therebetween. The emitter electrode 21 and the MOS capacitor electrode 20 are directly connected with an aluminum wiring. Other electrodes are connected to corresponding circuit components provided in other isolated regions although not shown, respectively. Thus, an integrated circuit is formed on the substrate.

The integrated circuit device thus constructed may be formed using a well-known method as follows.

Initially, a p-type silicon substrate 11 is prepared. An epitaxial growth is effected on the surface of the p-type silicon substrate 11 while doping n-type impurities such as phosphor into a reactive gas to form an n-type layer 12. In this instance, in order to form a conductive path of low resistance in a collector region, usually an n+ layer (buried layer) including an n-type impurity of arsenic etc. with high concentration is formed prior to the epitaxial growth. Then, an oxide film is grown on the upper surface of the epitaxial growth n-type layer 12. After the oxide film is etched by a photolithographic technology, a p+ isolation region 13 is formed by diffusing a p-type impurity such as boron with a high concentration to isolate the n-type layer 12 so that islands are formed. Thereafter, desired p-type regions 14 and 17, and n+ regions 15 and 16 are formed by repeatedly carrying out a process comprising the steps of forming an oxide film, effecting a photo-etching and diffusing. In this instance, a silicon dioxide film 18 is formed in the area of the capacitor by a CVD (Chemical Vapour Deposition) method or the like. Finally, after portions serving as electrodes are opened, aluminum is vacuum-deposited over the whole surface, thereafter to be etched so that wiring portions are left therefrom to form a wiring.

Figure 5:
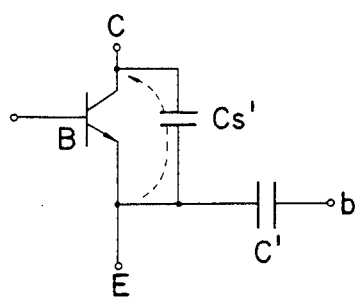
FIG. 5 is a circuit diagram showing a leakage current flow in the semiconductor device according to the present invention.

When the npn-transistor provided in the semiconductor device thus constructed is used as an emitter follower with common collector connection, an electric potential in the p-region 17 of the oxide film capacitor becomes lower than that in the n-region 12. As a result, since the pn junction is reverse-biased, a parasitic capacitance which has been produced between the substrate and the oxide film capacitor substantially becomes a capacitance $C_s'$ due to the pn junction. As shown in FIG. 5, the capacitance $C_s'$ exists between the emitter and the collector of the transistor constituting an emitter follower. As a result, since signals are inversely propagated as shown by an arrow, signal currents do not leak directly into the substrate, thereby preventing an increase in undesirable crosstalk. With practical products to which the present invention is applied, crosstalk is improved by the order of dB to that of 10 dB.

Figure 6:
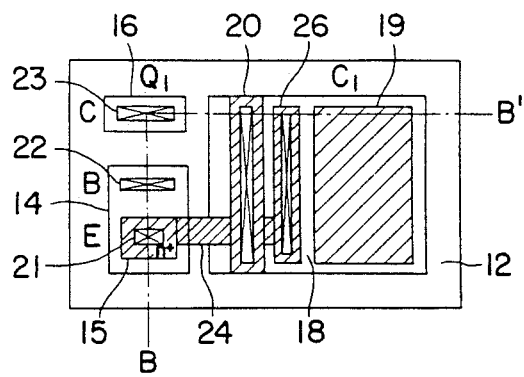
FIG. 6 is a plan view illustrating an embodiment of a semiconductor device according to the present invention.
Figure 7:
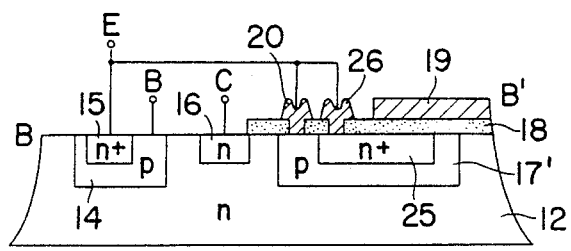
FIG. 7 is a cross sectional view taken along the lines B—B' shown in FIG. 6.

Referring to FIGS. 6 and 7, there is shown an embodiment according to the present invention, wherein FIG. 7 is a cross sectional view taken along the lines B-B' shown in a plan view of FIG. 6. The parts shown in FIGS. 6 and 7 similar to those shown in FIGS. 3 and 4 are designated by the same reference numerals, respectively. This embodiment differs from the structure shown in FIGS. 3 and 4 in that an n+ region 25 is formed within a p-region 17' serving as a conductive region of the oxide film capacitor, and in that the n+ region 25 is drawn through an electrode 26 and is commonly connected to the electrode 20 directly drawn from the p-type region 17'. In the configuration thus formed, the n-type region 12, the p-type region 17' and the n+ region 25 form an npn-transistor. Namely, according to this configuration, by enlarging the emitter region, the insulating film on the emitter region becomes thinner than that on the base region. Thus, this embodiment makes it possible to provide a predetermined capacitance within a small area.

Figure 8:
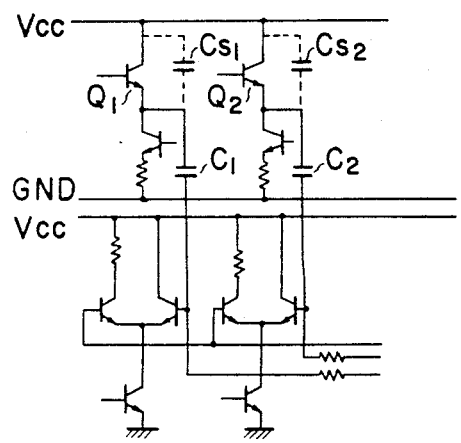
FIG. 8 is a circuit diagram for explaining how the present invention is applied to an actual integrated circuit.

Referring to FIG. 8, there is shown a circuit diagram partially illustrating an example to which the present invention is applied. The circuit of FIG. 8 shows an integrated circuit for video signals comprising two differential amplifiers, wherein npn-transistors $Q_1$ and $Q_2$ are used as emitter followers, and each output of the emitter followers are inputted through coupling capacitors $C_1$ and $C_2$ to each differential amplifier. In this circuit to which the present invention is applied, the transistor $Q_1$ and the capacitor $C_1$, and the transistor $Q_2$ and the capacitor $C_2$ are formed in the same n-type region (island). Accordingly, although there exist pn junction capacitors $C_{s1}$ and $C_{s2}$ occurring when forming oxide film capacitors between the collector and the emitter of the transistor $Q_1$ and between the collector and the emitter of the transistor $Q_2$. Accordingly, a parasitic capacitance, which results in leakage of signal currents with respect to the substrate, can be eliminated.

In a fining process, it is preferable to use an aluminum alloy, for example Al.Si.Cu etc. for an electrode wiring.

Advantages with the Invention

As stated above, according to the present invention, an npn-transistor which is connected in common collector manner and an oxide film capacitor of which the conductive region is a p-type region are formed with the same n-type region, and the p-type region of the oxide film capacitor is electrically connected to the emitter region of the npn-transistor. Accordingly, a parasitic capacitance being usually produced between the conductive region of the oxide film and the substrate is eliminated. As a result, signals are returned to the collector of the emitter follower, thereby making it possible to prevent crosstalk.

What is claimed is:

1. A semiconductor device comprising:
   (a) an npn-transistor formed within an n-type region surrounded by an isolation region, and connected in common collector manner;
   (b) an oxide film capacitor comprising a p-type region formed within said n-type region, an oxide film formed on said p-type region, and a metal layer formed on said oxide film; and
   (c) an element for electically connecting said p-type region of said oxide film capacitor to the emitter region of said npn-transistor and for deriving signals therefrom.

2. A semiconductor device acording to claim 1, wherein said electrically connecting element comprises a metal wire.

3. A semiconductor device according to claim 2, wherein said metal wire is comprised of aluminum.

4. A semiconductor device comprising:
   (a) an npn-transistor formed within an n-type region surrounded by an isolation region, and connected in common collector manner;
   (b) an oxide film capacitor comprising a p-type region formed within said n-type region, an oxide film formed on said p-type region, and a metal layer formed on said oxide film;
   (c) an additional npn-transistor comprising an n+ region formed within said p-type region, said p-type region and said n-type region; and
   (d) an element for electrically connecting said p-type region of said oxide film capacitor and the n+ region of said additional npn-transistor to the emitter region of said npn-transistor and for deriving signals therefrom.

5. A semiconductor device according to claim 4, wherein said electrically connecting element comprises a metal wire.

6. A semiconductor device according to claim 5, wherein said metal wire is comprised of aluminum.

7. A semiconductor device comprising:
- a p-type substrate;
- a first n-type region formed on said substrate;
- p$^+$-type isolation regions surrounding said n-type region;
- a p-type base region formed in said first n-type region;
- and n$^+$-type emitter region formed in said base region;
- an n$^+$-type collector region formed in said first n-type region;
- an oxide film capacitor comprising a p-type storage region formed in said first n-type region, an oxide film formed over said storage region, and a metal layer formed over said oxide film; and
- a means for electrically connecting said storage region to said emitter region.

8. The semiconductor device according to claim 7, wherein said connecting means comprises a metal wire.

9. The semiconductor device according to claim 8, wherein said wire is comprised of aluminum.

10. The semiconductor device according to claim 7, further comprising:
- a second n$^+$-type emitter region formed in said p-type storage region, wherein said second emitter region, said storage region, and said collector region form an npn-transistor; and
- means for electrically connecting said storage region to said second emitter region.

* * * * *